US008003534B2

(12) United States Patent
Chand

(10) Patent No.: US 8,003,534 B2
(45) Date of Patent: Aug. 23, 2011

(54) METHOD OF FORMING SEMICONDUCTOR DEVICES IN WAFER ASSEMBLY

(75) Inventor: Ami Chand, Fremont, CA (US)

(73) Assignee: Applied Nanostructures, Inc., Santa Clara, CA (US)

( * ) Notice: Subject to any disclaimer, the term of this patent is extended or adjusted under 35 U.S.C. 154(b) by 0 days.

(21) Appl. No.: 12/980,182

(22) Filed: Dec. 28, 2010

(65) Prior Publication Data
US 2011/0092046 A1 Apr. 21, 2011

Related U.S. Application Data

(62) Division of application No. 11/603,562, filed on Nov. 22, 2006, now Pat. No. 7,884,445.

(51) Int. Cl.
*H01L 21/44* (2006.01)
(52) U.S. Cl. ......... 438/678; 438/111; 438/110; 438/680
(58) Field of Classification Search .................. 438/678, 438/111, 110, 113, 680
See application file for complete search history.

(56) References Cited

U.S. PATENT DOCUMENTS

| 4,670,092 | A | 6/1987 | Motamedi |
| 5,998,234 | A | 12/1999 | Murata et al. |
| 6,016,693 | A | 1/2000 | Viani et al. |
| 6,780,767 | B2 * | 8/2004 | Lutter ............ 438/678 |

OTHER PUBLICATIONS

Chand et al., "Microfabricated Small Metal Cantilevers with Si Tip for Atomic Force Microscopy," Journal of Microelectromechanical Systems, vol. 9, No. 1, Mar. 2000, p. 112.
Aberson et al., "Water_Level Separation on MEMS Die with Standard Pick—and-Place Machines," http://www.collibbrys.com/files/pdf/ICMEMS2003.pdg.

* cited by examiner

*Primary Examiner* — Zandra Smith
*Assistant Examiner* — Paul Patton
(74) *Attorney, Agent, or Firm* — Charles S. Guenzer

(57) ABSTRACT

An apparatus and method for holding a semiconductor device in a wafer. A bar is connected to the wafer. A first sidewall comprises a first end and a second, and is connected to the bar at its first end. A first tab comprises a first end and a second end, and is connected to the second end of the first sidewall at its first end and connected to the first side of the semiconductor device at its second end. The thickness of the first tab is less than the thickness of the bar and the thickness of the first sidewall.

17 Claims, 15 Drawing Sheets

METHOD OF FORMING SEMICONDUCTOR DEVICES IN WAFER ASSEMBLY

RELATED APPLICATION

This application is a division of Ser. No. 11/603,562, filed Nov. 22, 2006, issue fee paid, and incorporated herein by reference.

FIELD OF THE INVENTION

The invention relates to the fabrication of semiconductor devices.

BACKGROUND ART

Semiconductor devices are typically fabricated on semiconductor wafers using silicon micromachining technology. Usually, each semiconductor wafer contains a large number of semiconductor devices, and each device may also be referred to as a "die." In the context of semiconductor technology, a die is a small piece of semiconductor material, such as Electronic-grade silicon, on which the device, such as an integrated circuit, is fabricated. During a typical fabrication process, a large batch of the devices is fabricated on a single wafer. The resulting wafer is cut into many small pieces, and each piece, called a "die," contains a copy of the device.

Often, each individual die contains moving mechanical parts that are required to be free to be operational. These moving mechanical parts are fabricated using the same semiconductor wafer and are attached to the die at one or more ends. The dies are in turned attached to a frame on the wafer by means of holding tabs to form a wafer assembly. The frame and the holding tabs are part of the micro-fabrication process and are fabricated simultaneously with the devices.

FIG. 1A illustrates a method of holding multiple semiconductor devices in a wafer assembly. FIG. 1B illustrates a backview of a magnified portion of the wafer assembly illustrated in FIG. 1A. Referring to FIGS. 1A and 1B, the wafer 100 contains multiple semiconductor devices 110 neatly lined up. Each device 110 is connected to one or more frames 120 by means of one or more holding tabs 130. That is, each device 110 is connected to one or more holding tabs 130, which in turn are connected to one or more frames 120. Gaps 140 exist between the devices 110 and the frames 120. The individual devices 110 are removed from and break free of the frames 120 by breaking the holding tabs 130. To do so, one may insert a pair of tweezers inside a gap 140, grab hold of a device 110, and firmly pick it out by applying a torsional force, breaking the holding tabs 130 in the process. Alternatively, one may press the device 110 downward until the holding tabs 130 break and then grab the device 110 with a pair of tweezers to lift it out of the frames 120.

In order to maximize the number of devices 110 per wafer 100 to reduce the cost of fabrication per die, the gaps 140 between the devices 110 and the frames 120 must be kept as small as possible. This necessitates the use of a pair of tweezers with extremely fine ends for the singulation process (breaking the devices 110 free of the frames 120). The edges of the devices 110 are normally very sharp due to etching and sharpening processes, and these sharp edges break easily while grabbing the devices 110 with the pair of tweezers. This results in a large number of fine silicon splinters, which are very fine particles, coming out of the devices' edges. The splinters may directly damage the devices 110 or electrostatically stick to the devices 110 to make them inoperational.

FIG. 2A illustrates another method of holding multiple semiconductor devices in a wafer assembly. FIG. 2B illustrates a back view of a magnified portion of the wafer assembly illustrated in FIG. 2A. Referring to FIGS. 2A and 2B, the wafer 200 contains multiple semiconductor devices 210 neatly lined up. Each device 210 is connected to one or more frames 220 via a single tab 230 terminated with a V-groove. The V-groove is formed while etching the wafer from the backside in a wet chemical anisotropic etching solution. The thickness of the semiconductor material, such as silicon, left after the V-groove termination is critical. To separate a device 210 from the frame 220 it connects to, pressure is applied at the point where the V-grooves meets. However, since the pressure is applied only at one side of the device 210, the device 210 has a tendency to flip over and may damage the delicate device 210. The gap and sharp tweezer argument is also valid for this arrangement.

Accordingly, what is needed is a system and a method to address the above-identified problems. The present invention addresses such a need.

SUMMARY OF THE INVENTION

Broadly speaking, the invention relates to holding a semiconductor device in a wafer via a bar connected to the wafer, a sidewall connected to the bar, and a holding tab connected to the sidewall and the semiconductor, such that the thickness of the holding tab is less than the thickness of the bar and the sidewall for easy breaking.

In one embodiment of the invention, an apparatus for holding a semiconductor device in a wafer is described. A bar is connected to the wafer, which provides a frame for the semiconductor device to connect to. A first sidewall, comprising a first end and a second end, is connected to the bar at its first end. A first tab, comprising a first end and a second end, is connected to the second end of the first sidewall at its first end and connected to a first side of the semiconductor device at its second end. The thickness of the first tab is less than the thickness of the bar and the thickness of the first sidewall so that the first tab may be broken easily. The first sidewall and the first tab form a holder for holding the semiconductor device, and the semiconductor device is connected to the bar via this holder.

In another embodiment of the invention, an apparatus for holding a semiconductor device in a wafer is described. A bar is connected to the wafer, which provides a frame for the semiconductor device to connect to. A first sidewall, comprising a first end and a second end, is connected to the bar at its first end. A second sidewall, comprising a first end and a second end, is connected to the bar at its first end. A first tab, comprising a first end and a second end, is connected to the second end of the first sidewall at its first end and connected to a first side of the semiconductor device at its second end. A second tab, comprising a first end and a second end, is connected to the second end of the second sidewall at its first end and connected to a second side of the semiconductor device at its second end. The thickness of the first tab and the thickness of the second tab are less than the thickness of the bar, the thickness of the first sidewall, and the thickness of the second sidewall, so that the first tab and the second tab may be broken easily. The first sidewall, the second sidewall, the first tab, and the second tab form a holder for holding the semiconductor device, and the semiconductor device is connected to the bar via the holder.

In another embodiment of the invention, a method for holding a semiconductor device in a wafer is provided, by connecting a bar to the wafer, connecting a first sidewall to the bar, and connecting a first tab to the first sidewall and the semiconductor device. The thickness of the first tab is less than the thickness of the bar and the thickness of the first sidewall, so that the first tab may be broken easily. The first sidewall and the first tab form an L-shaped holder for holding the semiconductor device and connecting the semiconductor device to the bar.

In another embodiment of the invention, a method for holding a semiconductor device in a wafer is provided, by connecting a bar to the wafer, connecting a first sidewall to the bar, connecting a second sidewall to the bar, connecting a first tab to the first sidewall and the semiconductor device, and connecting a second tab to the second sidewall and the semiconductor device. The thickness of the first tab and the thickness of the second tab are less than the thickness of the bar, the thickness of the first sidewall, and the thickness of the second sidewall, so that the first tab and the second tab may be broken easily. The first sidewall, the second sidewall, the first tab, and the second tab form a U-shaped holder for holding the semiconductor device and connecting the semiconductor device to the bar.

In another embodiment of the invention, a method for forming a semiconductor device holder on a wafer is provided, by etching a pattern of a semiconductor device, a bar, a first sidewall, a second sidewall, a first tab, and a second tab into the wafer. The thickness of the first tab and the thickness of the second tab are less than the thickness of the bar, the thickness of the first sidewall, and the thickness of the second sidewall, so that the first tab and the second tab may be broken easily. The first sidewall, the second sidewall, the first tab, and the second tab form a U-shaped holder for holding the semiconductor device and connecting the semiconductor device to the bar.

Other aspects and advantages of the invention will become apparent from the following detailed description taken in conjunction with the accompanying drawings.

DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE SELECTED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. In addition, while the invention will be described in conjunction with the particular embodiments, it will be understood that it is not intended to limit the invention to the described embodiments. To the contrary, it is intended to cover alternatives, modifications, and equivalents as may be included within the spirit and scope of the invention as defined by the appended claims.

As explained above, during the fabrication of semiconductor devices, typically, many semiconductors devices, each one a die, form an assembly on a semiconductor wafer. The dies are held in place by connecting them to one or more frames, so that they remain stationary and may be worked on during the fabrication process. After the fabrication process is completed, individual dies are broken free of the frames. The present invention describes an apparatus and method for holding the dies in place in a wafer assembly during the fabrication of the semiconductor devices.

Figure 3A:
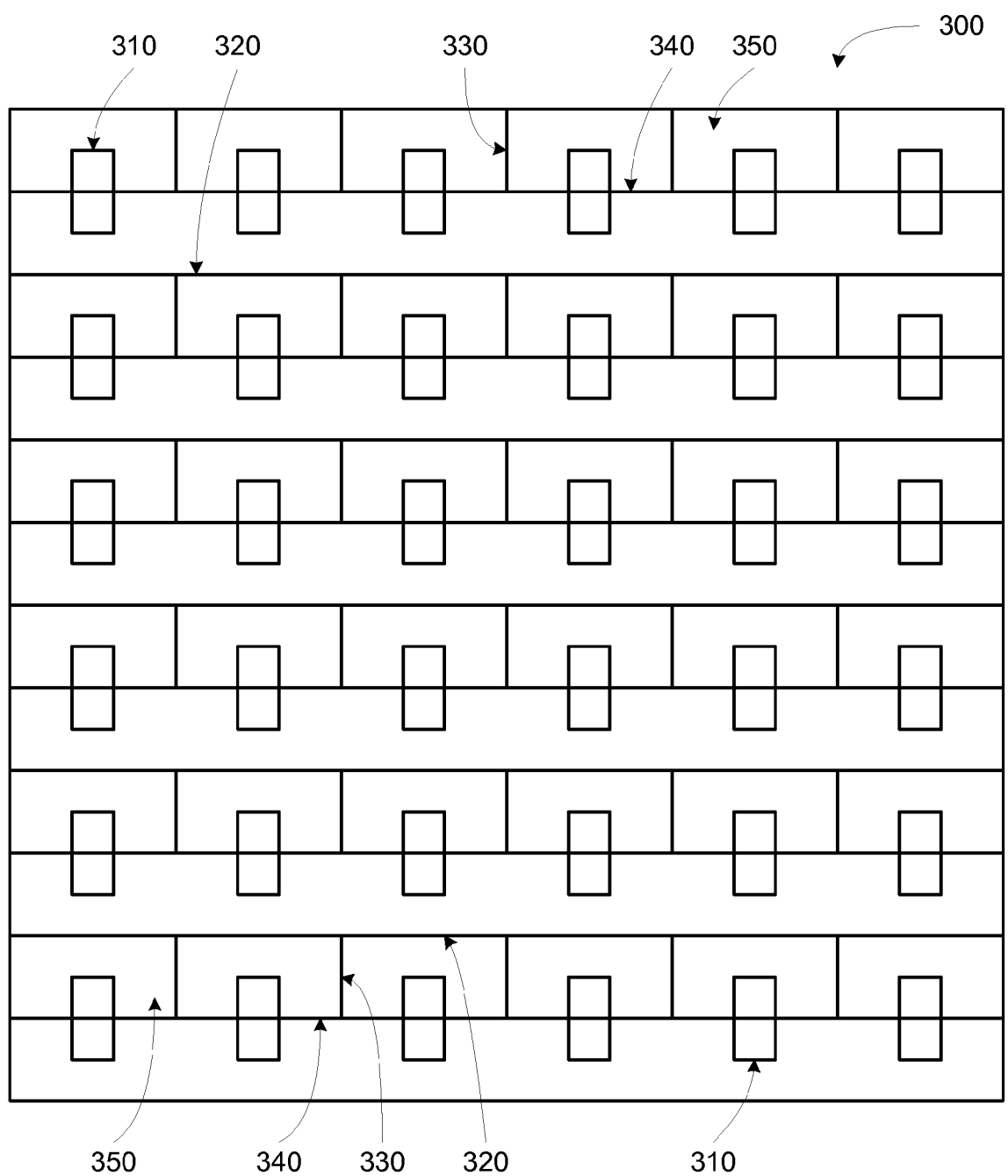
FIG. 3A illustrates a U-shaped holder for holding a semiconductor device and connecting the device to a frame in a wafer assembly.
Figure 3B:
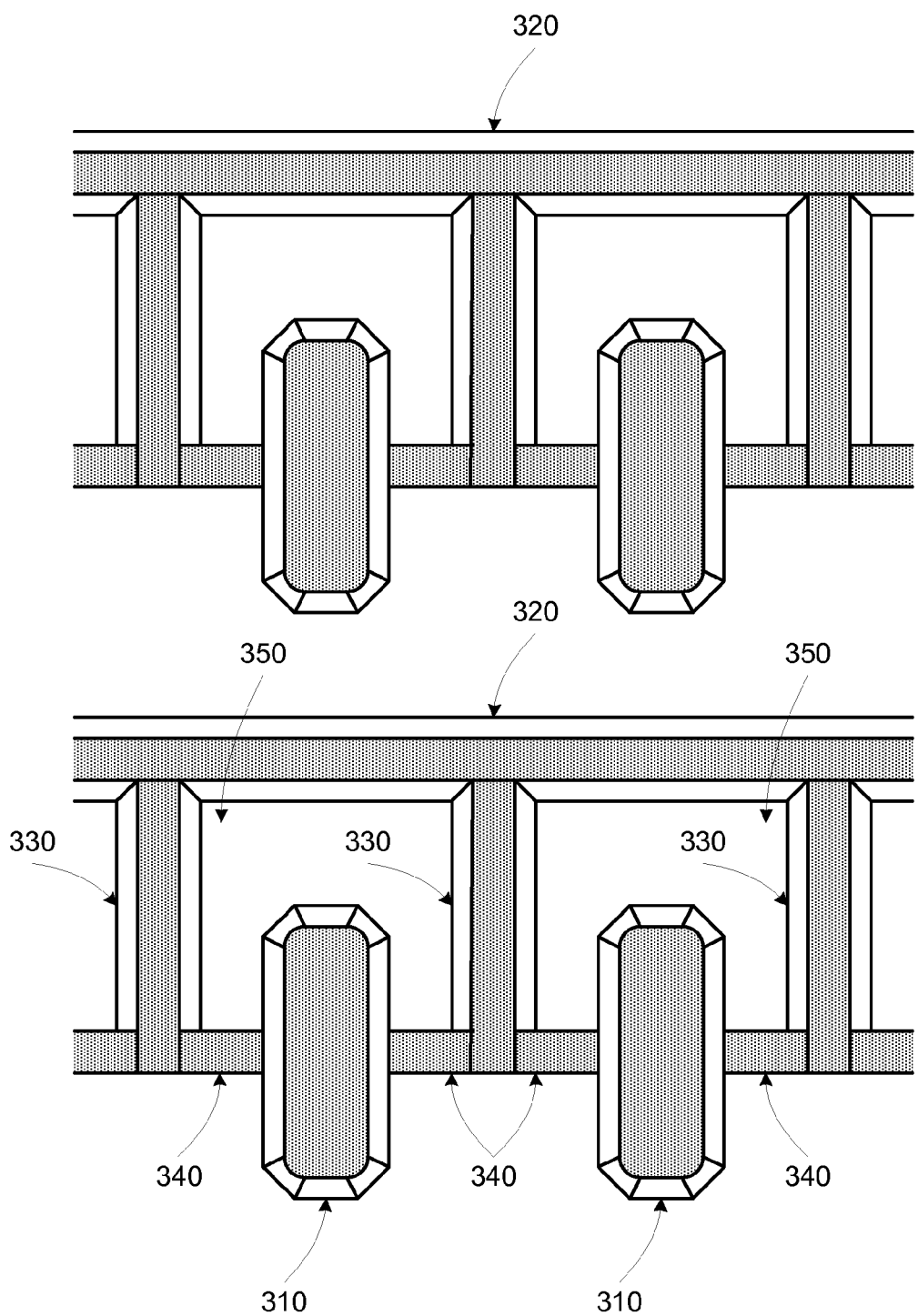
FIG. 3B illustrates a back or bottom view of a magnified portion of the wafer assembly illustrated in FIG. 3A.
Figure 3C:
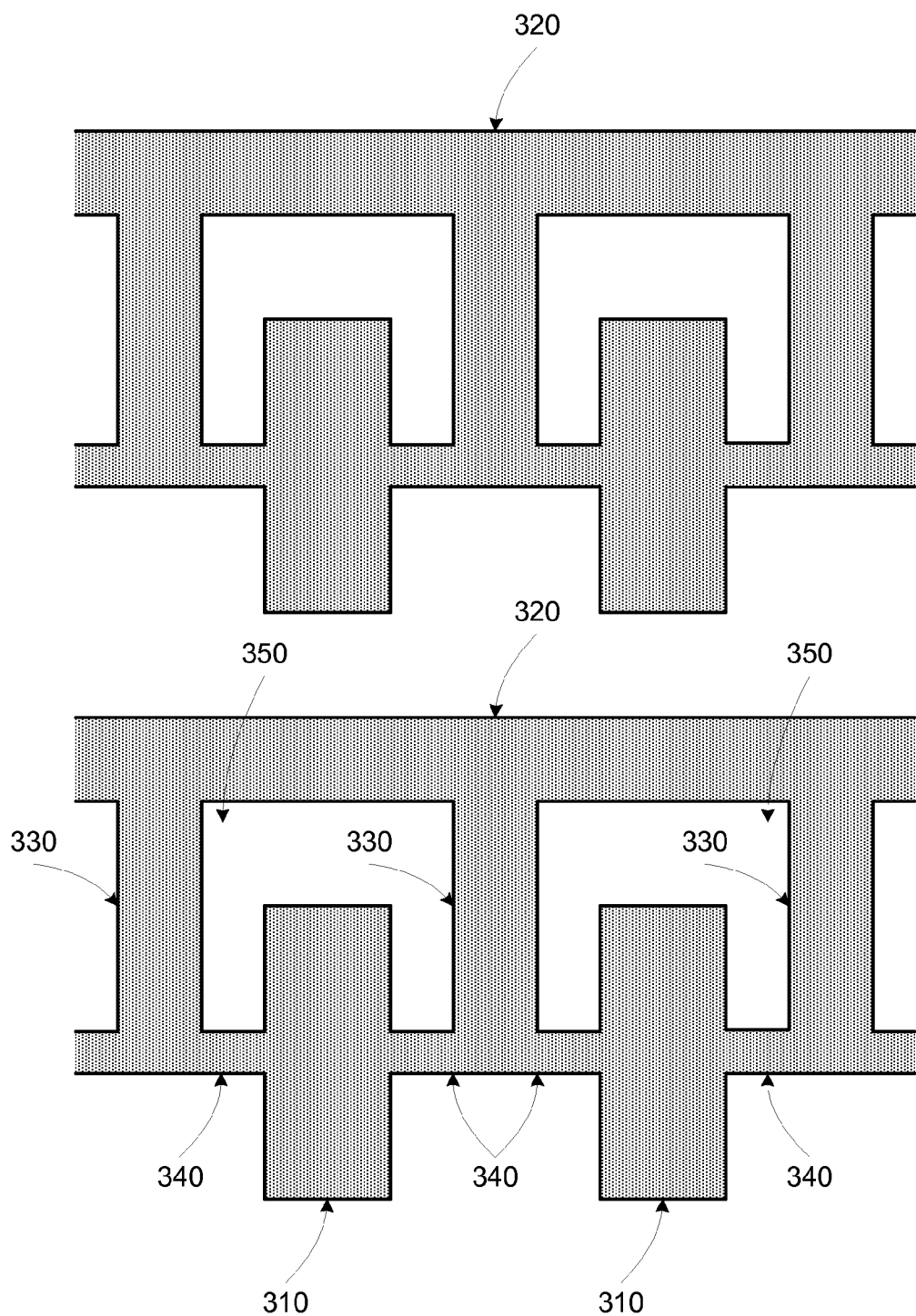
FIG. 3C illustrates a corresponding front or top view of a magnified portion of the wafer assembly illustrated in FIG. 3A.

FIG. 3A illustrates a U-shaped holder for holding a semiconductor device and connecting the device to a frame in a wafer assembly. FIG. 3B illustrates a back or bottom view of a magnified portion of the wafer assembly illustrated in FIG. 3A. FIG. 3C illustrates a corresponding front or top view of a magnified portion of the wafer assembly illustrated in FIG. 3A. FIGS. 3A, 3B, and 3C together may provide a better and clearer understanding of the U-shaped holder.

In this embodiment of the invention, the wafer 300 contains multiple semiconductor devices 310 neatly lined up. A series of horizontal bars 320 are connected to the wafer 300. These bars 320 are the frames to which the devices 310 are ultimately connected. To achieve maximum capacity of the dies per wafer, the bars 320 are arranged in parallel to each other. A series of sidewalls 330 are connected to the bars 320. The sidewalls 330 are in parallel to each other but in perpendicular to the bars 320. The semiconductor devices 310 are held in between the sidewalls 330 via small holding tabs 340. The holding tabs 340 are in parallel to the bars 320 but in perpendicular to the sidewalls 330. There are gaps 350 between the devices 310 and the adjacent bars 320 and sidewalls 330.

More specifically, for each single device 310, its assembly holder consists of two sidewalls 330, one on each side of the device 310, and two holding tabs 340, also one on each side of the device 310. The two sidewalls 330 connect to the bar 320 at one end and to the two tabs 340 at the other opposite end respectively (the left sidewall 330 connects to the left tab 340 at one end and the right sidewall 330 connects to the right tab 340 at one end). The two tabs 340 further connect to the device 310 at the other end respectively (the left tab 340 connects to the left side of the device 310 and the right tab 340 connects to the right side of the device 310), thus holding the device 310 in between the two sidewalls 330. The two sidewalls 330 and the two tabs 340 together form a U-shaped holder for the device 310 and connect the device 310 to the frame bar 320. To achieve maximum capacity of the dies per wafer, two adjacent devices 310 share a common sidewall 330 in between them.

The devices 310 are freed from the assembly 300 by breaking the holding tabs 340. To ensure that the tabs 340 break easily, the thickness of the tabs 340 is less than the thickness of the bars 320 and the sidewalls 330, so that when applying pressure to break away the devices 310, the tabs 340 break before the bars 320 and the sidewalls 330.

Preferably, the thickness of the tabs 340 is less than or equal to 50% of the thickness of the bars 320 and the sidewalls 330. More preferably, the thickness of the tabs 340 is less than or equal to 30% of the thickness of the bars 320 and the sidewalls 330. Most preferably, the thickness of the tabs 340 is less than or equal to 10% of the thickness of the bars 320 and the sidewalls 330.

Preferably, the thickness of the tabs 340 is less than or equal to 100 micrometers (microns). More preferably, the thickness of the tabs 340 is less than or equal to 75 microns. Even more preferably, the thickness of the tabs 340 is less than or equal to 50 microns. Most preferably, the thickness of the tabs 340 is less than or equal to 30 microns.

Preferably, although not required, all the bars 320, the sidewalls 330, and the devices 310 in an assembly have the same thickness. More preferably, the thickness of the bars 320, the sidewalls 330, and the devices 310 equal to the thickness of the wafer itself. Preferably, although not required, all the tabs 340 in an assembly have the same thickness.

Comparing the magnified back or bottom view of the portion of the wafer assembly illustrated in FIG. 3B with the magnified front or top view of the corresponding portion of the wafer assembly illustrated in FIG. 3C, the bottom surface of the assembly is somewhat uneven, while the top surface is smooth. Preferably, although not required, the top surface is kept smooth so that specified types of devices, such as integrated circuits or sensors for microscope scanning probes, may be fabricated on the top side of the dies 310.

Figure 3D:
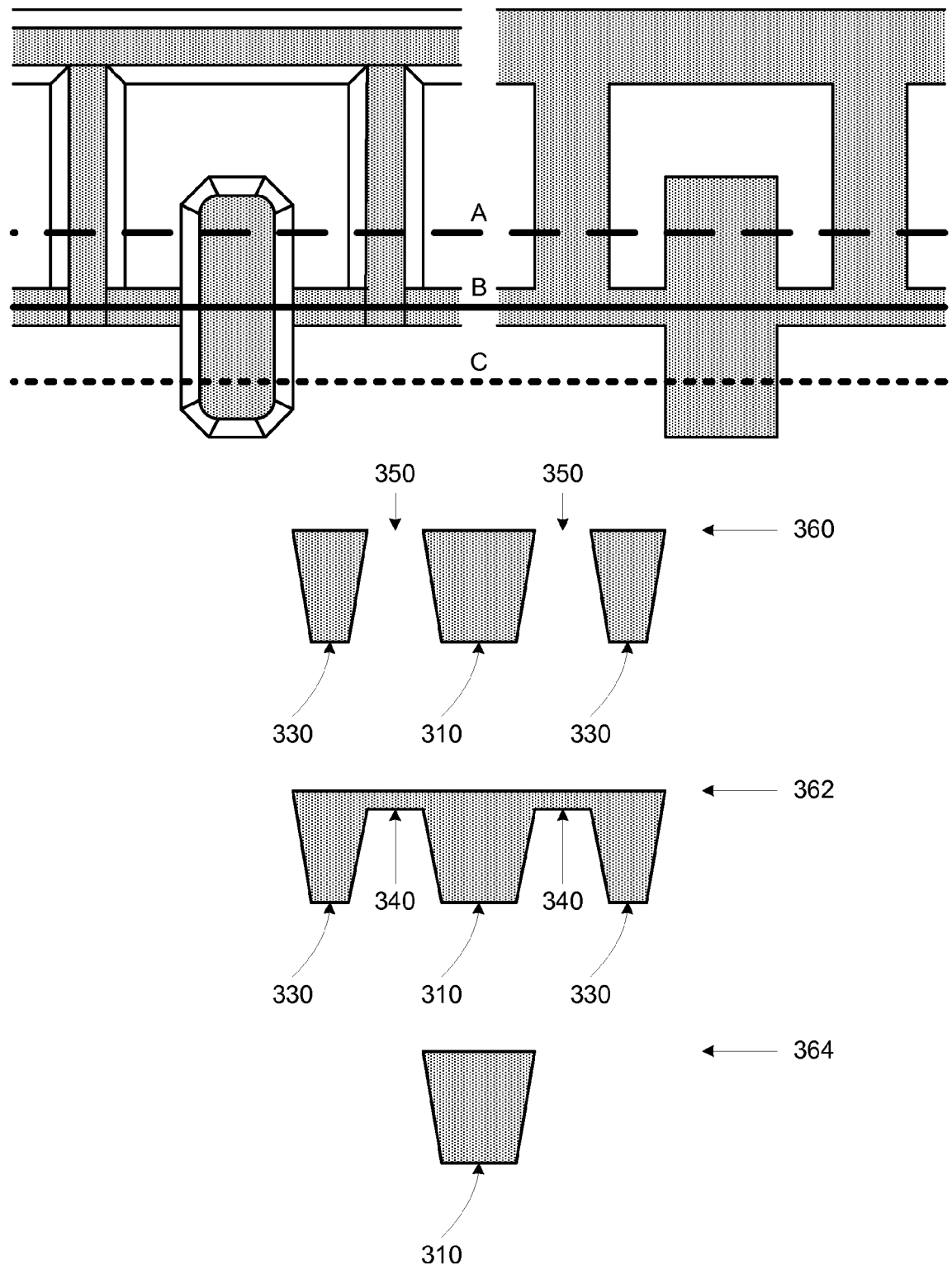
FIG. 3D illustrates three cross-sectional views of a single semiconductor device along with its U-shaped holder.

To further clarify the structure of this embodiment of the invention, FIG. 3D illustrates three cross-sectional views of a single semiconductor device along with its U-shaped holder. Cross-section 360 is taken at the location marked by dashed line A. Cross-section 362 is taken at the location marked by solid line B. Cross-section 364 is taken at the location marked by dotted line C.

At cross-section 360, there are two sidewalls 330, one on each side of the device 310. The device 310 is in between the two sidewalls 330. There is a gap 350 between the device 310 and each of the two sidewalls 330.

At cross-section 362, in addition to the device 310 and the two sidewalls 330, there are two tabs 340, one on each side of the device 310 and connecting the device 310 to the two sidewalls 330 respectively. As shown, the thickness of the two tabs 340 is significantly less than the thickness of the two sidewalls 330 and the device 310. In other words, the two tabs 340 are significantly thinner than the two sidewalls 330 and the device 310.

At cross-section 364, there is only the device 310, since the sidewalls 330 have terminated at the location of the holding tabs 340.

Figure 4A:
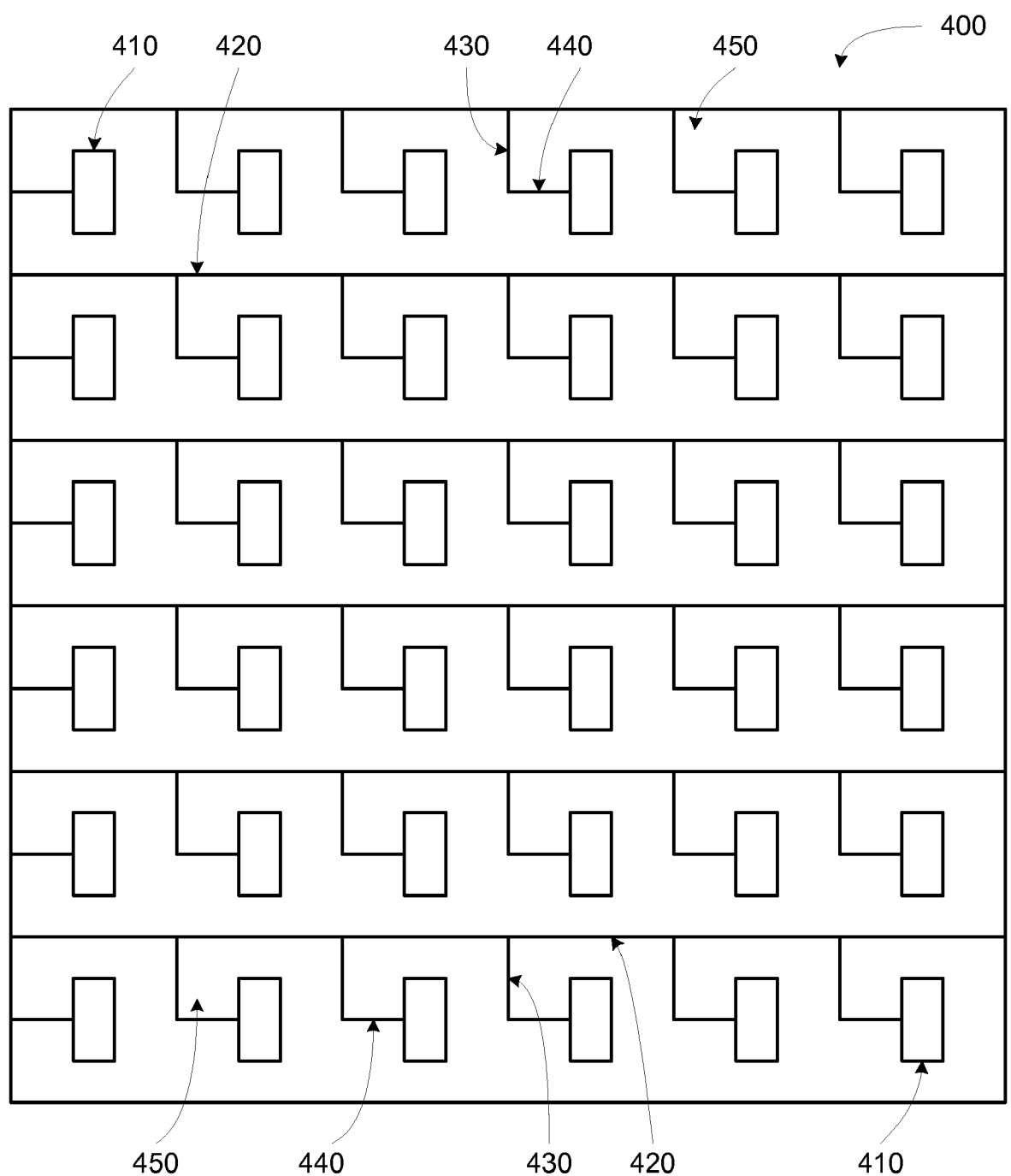
FIG. 4A illustrates an L-shaped holder for holding a semiconductor device and connecting the device to a frame in a wafer assembly.
Figure 4B:
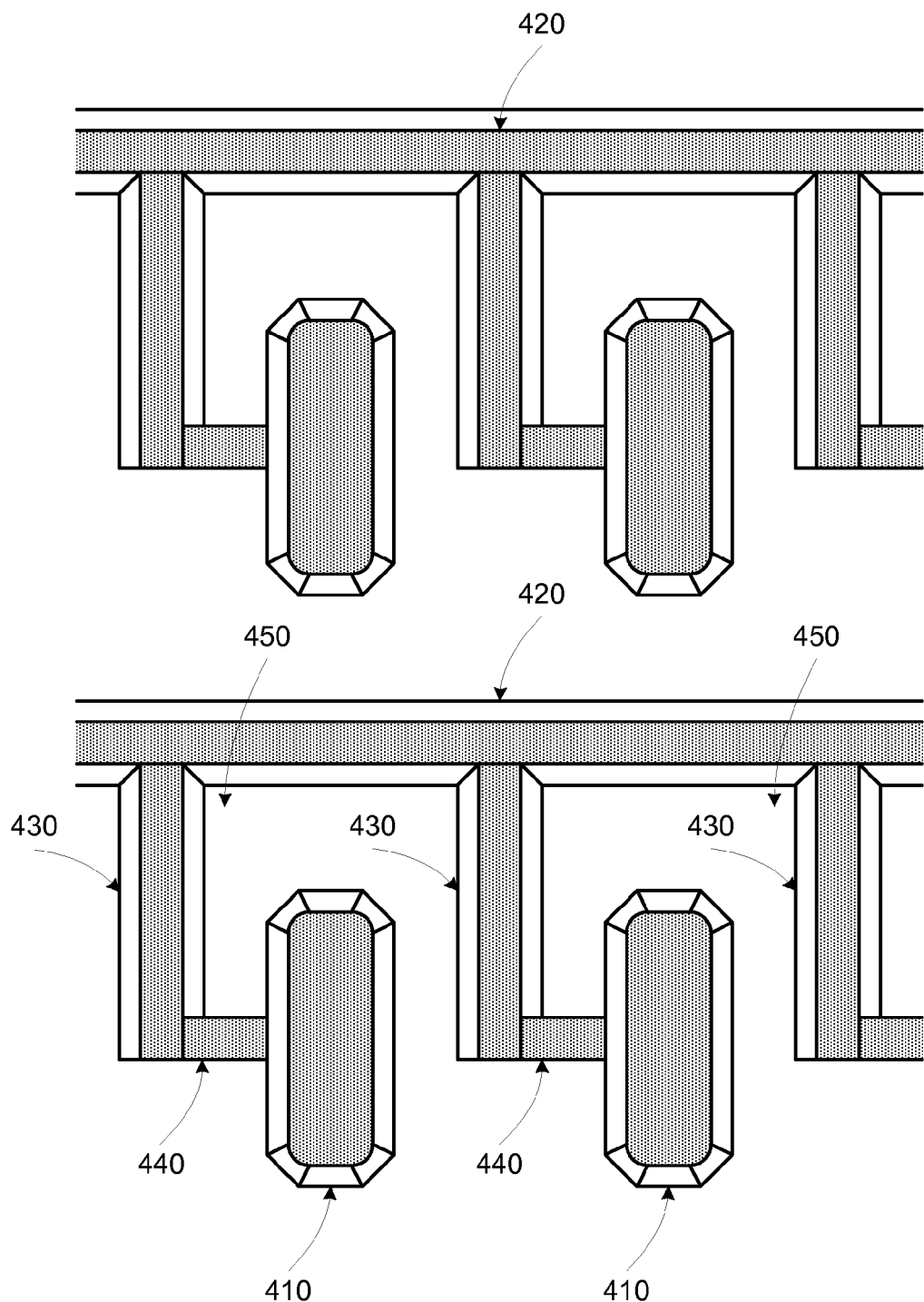
FIG. 4B illustrates a back or bottom view of a magnified portion of the wafer assembly illustrated in FIG. 4A.
Figure 4C:
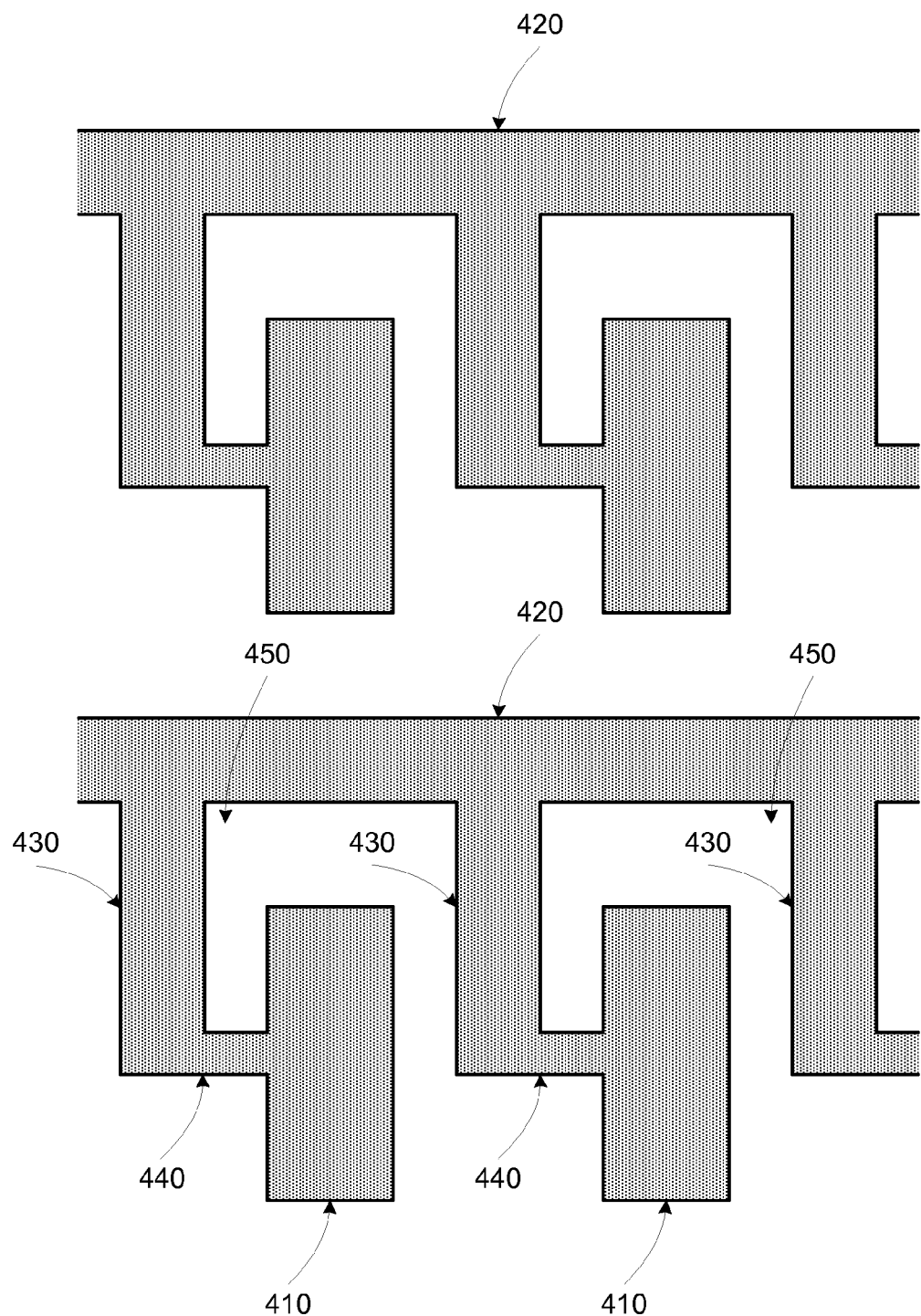
FIG. 4C illustrates a corresponding front or top view of a magnified portion of the wafer assembly illustrated in FIG. 4A.

FIG. 4A illustrates an L-shaped holder for holding a semiconductor device and connecting the device to a frame in a wafer assembly. FIG. 4B illustrates a back or bottom view of a magnified portion of the wafer assembly illustrated in FIG. 4A. FIG. 4C illustrates a corresponding front or top view of a magnified portion of the wafer assembly illustrated in FIG. 4A. FIGS. 4A, 4B, and 4C together may provide a better and clearer understanding of the U-shaped holder. This embodiment of the invention mainly differs from the embodiment described in FIGS. 3A to 3D above in that the device holder only consists of one sidewall and one holding tab on one side of the device, and the single sidewall and tab form an L-shaped holder for holding the device.

In this embodiment of the invention, again, the wafer 400 contains multiple semiconductor devices 410 neatly lined up. A series of horizontal bars 420 are connected to the wafer 400. These bars 420 are the frames to which the devices 410 are ultimately connected. To achieve maximum capacity of the dies per wafer, the bars 420 are arranged in parallel to each other. A series of sidewalls 430 are connected to the bars 420. The sidewalls 430 are in parallel to each other but in perpendicular to the bars 420. The semiconductor devices 410 are connected to the sidewalls 430 via small holding tabs 440. The holding tabs 440 are in parallel to the bars 420 but in perpendicular to the sidewalls 430. There are gaps 450 between the devices 410 and the adjacent bars 420 and sidewalls 430.

More specifically, for each single device 410, its assembly holder consists of one sidewall 430 and one holding tab 440. The sidewall 430 connects to the bar 420 at one end and to the tab 440 at the other opposite end. The tab 440 further connects to the device 410 at the other end, thus holding the device 410. The sidewall 430 and the tab 440 together form an L-shaped holder for the device 410 and connect the device 410 to the frame bar 420.

The devices 410 are freed from the assembly 400 by breaking the holding tabs 440. To ensure that the tabs 440 break easily, the thickness of the tabs 440 is less than the thickness of the bars 420 and the sidewalls 430, so that when applying pressure to break away the devices 410, the tabs 440 break before the bars 420 and the sidewalls 430. The preferred thicknesses for the devices, the bars, the sidewalls, and the tabs described above in FIGS. 3A to 3D also apply to this embodiment of the invention.

Figure 5:
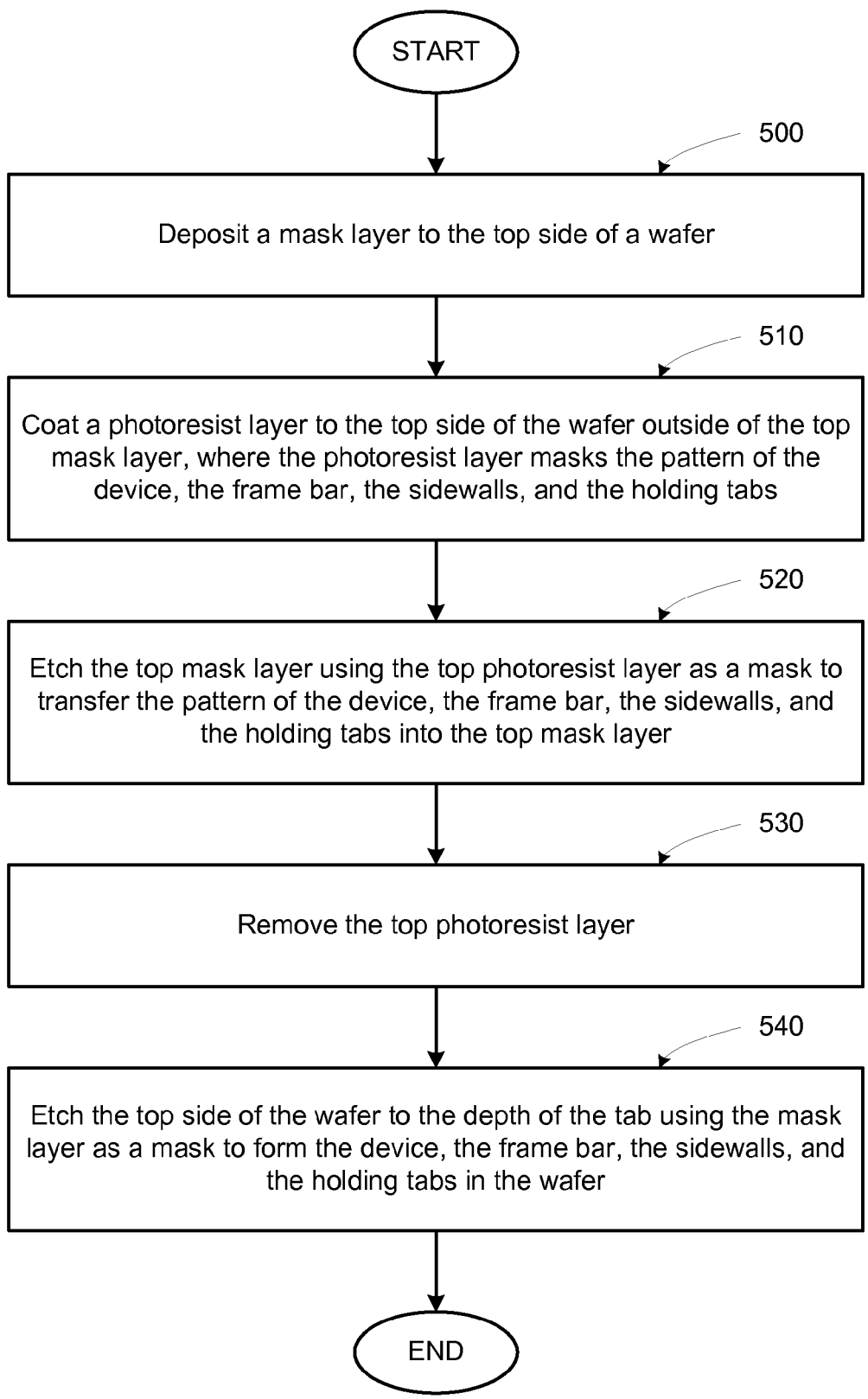
FIG. 5 illustrates a flowchart for etching a pattern of the assembly described in FIGS. 3A to 3D to the top side of a wafer.
Figure 7:
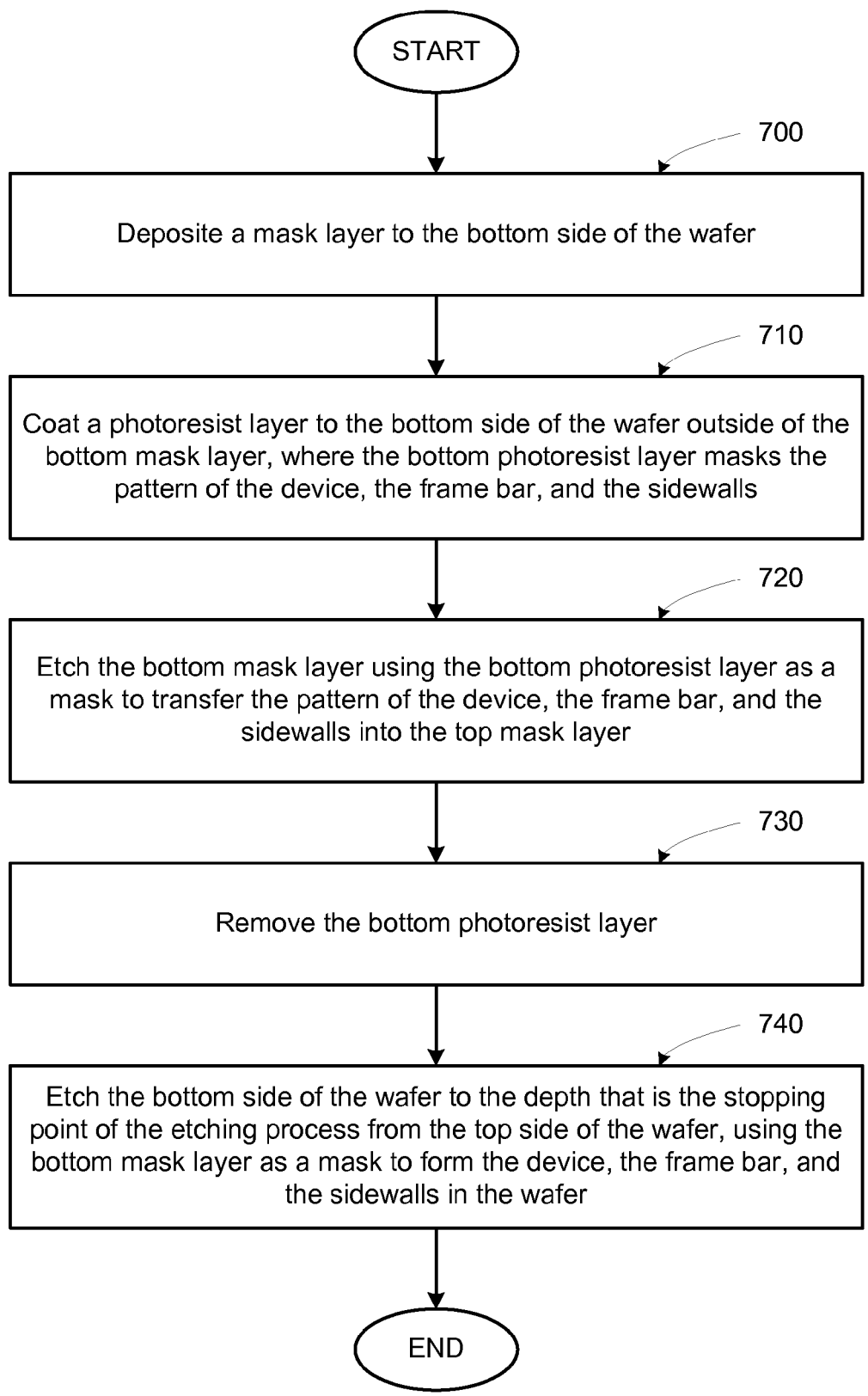
FIG. 7 illustrates a flowchart for etching a pattern of the assembly described in FIGS. 3A to 3D to the bottom side of a wafer.

FIGS. 5 and 7 describe a method for forming the wafer assembly described in FIGS. 3A to 3D. In this embodiment of the invention, in order to create the devices, the bars, the U-shaped holders that includes the two sidewalls and the two tabs, a wafer is etched both from its top and its bottom. Essentially, the gaps between the devices, the bars, the sidewalls, and the tabs are removed (etched away), leaving behind only the devices, the frame bars, the sidewalls, and the holding tabs. The same method may be used to form the wafer assembly described in FIGS. 4A to 4C, by slightly modifying the etching pattern.

FIG. 5 illustrates a flowchart for etching a pattern of the assembly described in FIGS. 3A to 3D to the top side of a wafer. FIGS. 6A to 6D illustrate cross-sections of the wafer during the steps described in FIG. 5. These cross-sections are taken at the location marked by dashed line A shown in FIG. 3D.

Figure 6A:
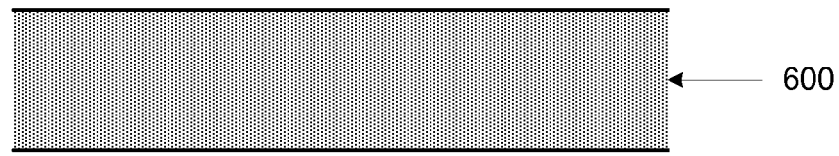
FIGS. 6A to 6D illustrate cross-sections of the wafer during the steps described in FIG. 5.
Figure 6B:
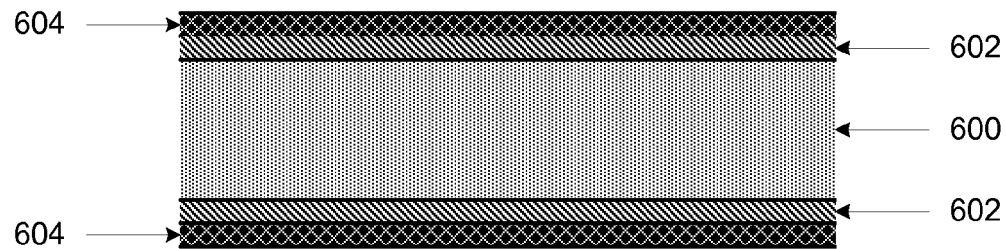
Figure 6C:
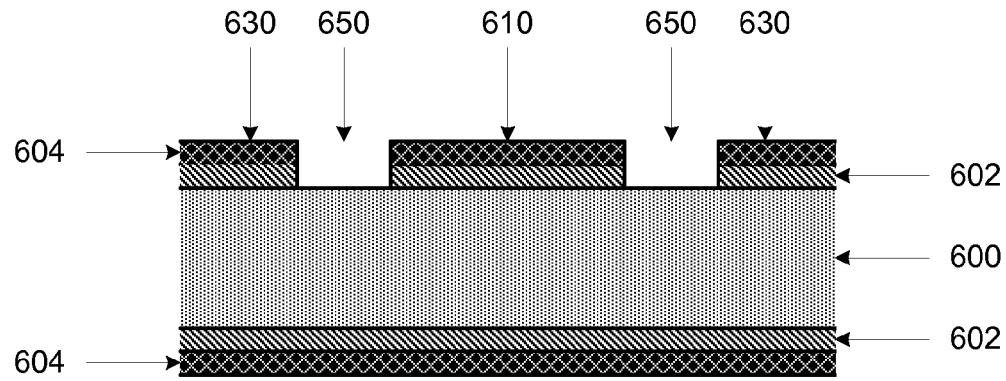
Figure 6D:
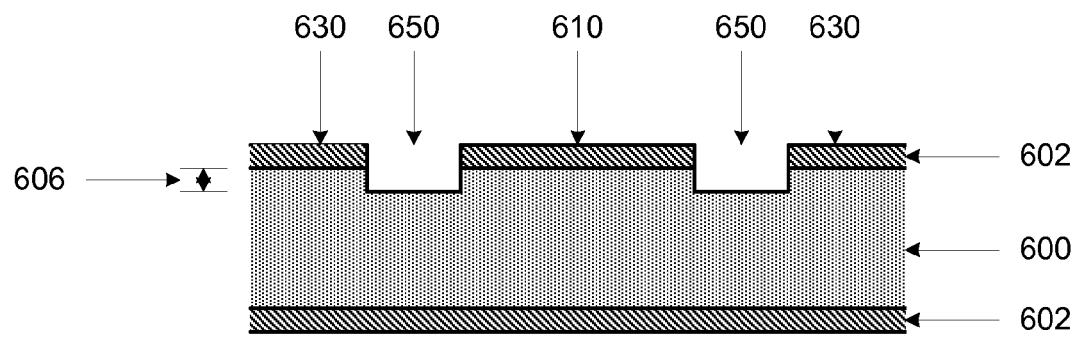

Referring to FIG. 5, at STEP 500, a mask layer is deposited to the top side of the wafer. Optionally, a mask layer is also deposited to the bottom side of the wafer to protect the wafer during the etching process. This step corresponds to FIGS. 6A and 6B. FIG. 6A shows a pristine wafer 600, before any process has been done to it. FIG. 6B shows a mask layer 602 is deposited to both the top and the bottom side of the wafer 600.

Referring to FIG. 5, at STEP 510, a photoresist layer is coated to the top side of the wafer outside of the top mask layer, and this photoresist layer masks the pattern of the semiconductor device, the frame bar, the two sidewalls, and the holding tabs. Optionally, a photoresist layer is also coated to the bottom side of the wafer outside the bottom mask layer to protect the wafer during the etching process. However, since etching is only done from the top side of the wafer, the bottom photoresist layer contains no pattern. This step also corresponds to FIG. 6B, which shows a photoresist layer 604 coated outside both the top and the bottom mask layers 602.

Referring to FIG. 5, at STEP 520, the top mask layer is etched using the top photoresist layer as a mask to transfer the pattern of the device, the frame bar, the two sidewalls, and the two holding tabs into to the top mask layer. This step corresponds to FIG. 6C, which shows that the gaps 650 between the device 610 and the two sidewalls 630 are etched away, only leaving behind the device 610 and the sidewalls 630. The frame bar and the two holding tabs are not shown in FIG. 6C due to the location of the cross-section.

Referring to FIG. 5, at STEP 530, the top photoresist layer is removed. Optionally, the bottom photoresist layer is also removed. This step corresponds to FIG. 6D, which shows that only the mask layer 602 is left.

Referring to FIG. 5, at STEP 540, the top side of the wafer is etched using the top mask layer as a mask to form the device, the frame bar, the two sidewalls, and the holding tabs in the wafer. The wafer is etched to the depth of the thickness of the tabs. In other words, the amount or depth 606 of etching done to the top side of the wafer approximately equals the thickness of the holding tabs. This step also corresponds to FIG. 6D, which shows that the gaps 650 between the device 610 and the two sidewalls 630 are partially etched away, only leaving behind the device 610 and the sidewalls 630. The frame bar and the two holding tabs are not shown in FIG. 6D due to the location of the cross-section.

Optionally, the top and bottom mask layers 602 are removed after the etching process is completed.

FIG. 7 illustrates a flowchart for etching a pattern of the assembly described in FIGS. 3A to 3D to the bottom side of a wafer. FIGS. 8A to 8D illustrate cross-sections of the wafer during the steps described in FIG. 7. These cross-sections are taken at the location marked by solid line B shown in FIG. 3D.

Referring to FIG. 7, at STEP 700, a mask layer is deposited to the bottom side of the wafer. Optionally, a mask layer is also deposited to the top side of the wafer to protect the wafer during the etching process. This step corresponds to FIGS. 8A, which shows a mask layer 802 is deposited to both the top and the bottom side of the wafer 800.

Referring to FIG. 7, at STEP 710, a photoresist layer is coated to the bottom side of the wafer outside of the bottom mask layer, and this photoresist layer masks the pattern of the semiconductor device, the frame bar, and the two sidewalls. Note that the pattern does not include the two holding tabs. The pattern of the bottom photoresist layer is aligned with the pattern etched into the top side of the wafer from FIG. 5. Optionally, a photoresist layer is also coated to the top side of the wafer outside the top mask layer to protect the wafer during the etching process. However, since etching is only done from the bottom side of the wafer, the top photoresist layer contains no pattern. This step also corresponds to FIG. 8A, which shows a photoresist layer 804 coated outside both the top and the bottom mask layers 802.

Referring to FIG. 7, at STEP 720, the bottom mask layer is etched using the bottom photoresist layer as a mask to transfer the pattern of the device, the frame bar, and the two sidewalls into to the bottom mask layer. This step corresponds to FIG. 8B, which shows that the gaps (not shown) between the device 810 and the two sidewalls 830 as well as the tabs 840 are etched away, only leaving behind the device 810 and the sidewalls 830. The frame bar is not shown in FIG. 8B due to the location of the cross-section.

Referring to FIG. 7, at STEP 730, the bottom photoresist layer is removed. Optionally, the top photoresist layer is also removed.

Referring to FIG. 7, at STEP 740, the bottom side of the wafer is etched using the bottom mask layer as a mask to form the device, the frame bar, and the two sidewalls in the wafer. The wafer is etched to the point where the etching from the top side of the wafer as described in FIG. 5 is stopped. In other words, the amount or depth 806 of etching done to the bottom side of the wafer approximately equals the thickness of the wafer minus the thickness of the holding tabs. This step corresponds to FIG. 8C, which shows that the gaps (not shown) between the device 810 and the two sidewalls 830 as well as the tabs 840 are etched away, only leaving behind the device 810 and the sidewalls 830. The frame bar is not shown in FIG. 8C due to the location of the cross-section.

Recall that in FIG. 5, the wafer is etched from the top to the depth of the thickness of the holding tabs. The top etching process is done based on a pattern that includes the semiconductor devices, the frame bars, the sidewalls, and the holding bars. The bottom etching process is done based on a pattern that only includes the semiconductor devices, the frame bars, and the sidewalls, to the depth that approximately equals the thickness of the wafer minus the thickness of the holding bars. In effect, the etching from the bottom side of the wafer "meets up" with the etching from the top side of the wafer. The holding tabs are not etched away from the top side, but are etched away from the bottom side of the wafer, which results in the holding tabs to be thinner than the devices, the bars, and the sidewalls. The gaps between the devices, the bars, the sidewalls, and the bars are etched away from both the top side and the bottom side of the wafer, which results in the gaps being completely etched away.

Figure 8A:
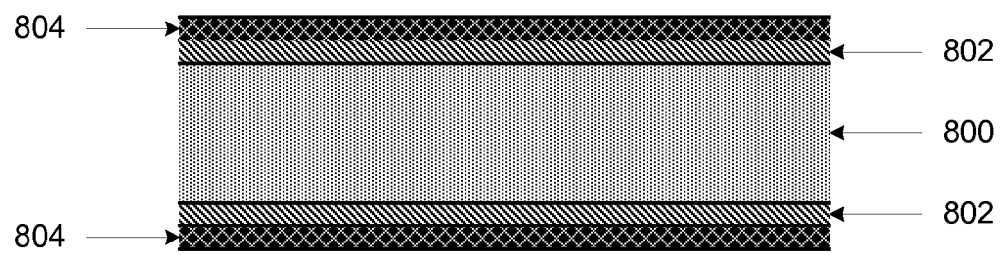
FIGS. 8A to 8D illustrate cross-sections of the wafer during the steps described in FIG. 7.
Figure 8B:
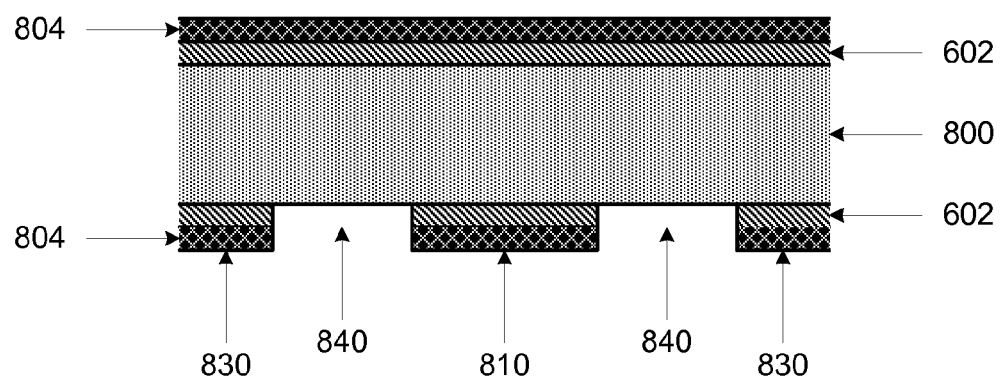
Figure 8C:
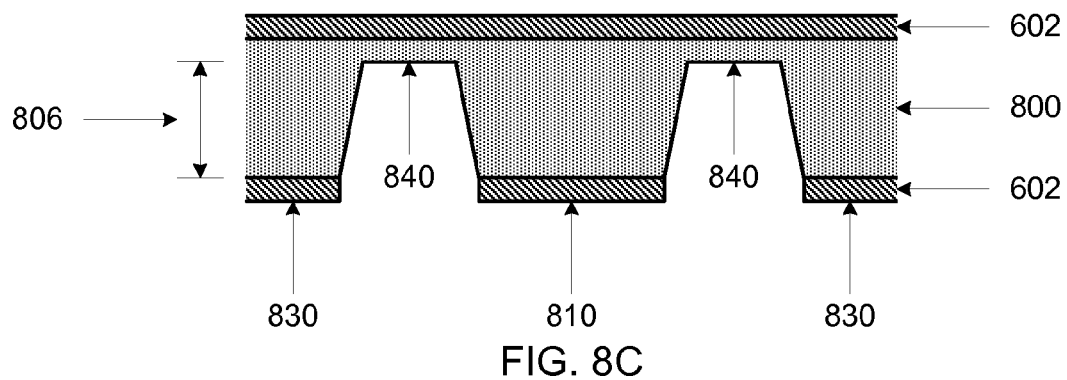
Figure 8D:
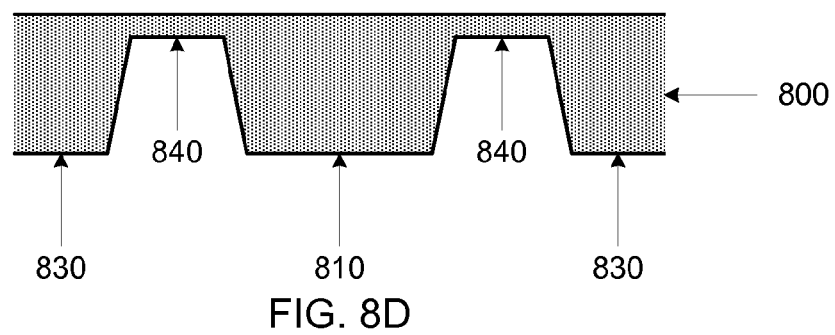

Lastly, the bottom mask layer is removed. Optionally, the top mask layer is also removed. The wafer is stripped clean, leaving only the resulting assembly from the etching processes. The final wafer is shown in FIG. 8D.

In this embodiment of the invention, the entire wafer assembly is formed using a wafer. This means the semiconductor devices, the frame bars, and sidewalls, and the holding tabs all come from the same wafer, which implies they are of the same semiconductor material. Although the device is described as being connected to the tabs, the tabs connected to the sidewalls, and the sidewalls connected to the bars, the word "connect" does not necessarily mean that there is a break in the material between the device and the holding tabs, between the tabs and the sidewalls, and between the sidewalls and the frame bars. The word "connect" only describes a concept in order to separate different parts of the wafer assembly.

However, in another embodiment of the invention, it is possible that the semiconductor devices, the frame bars, the side walls, the holding tabs may be manufactured individually, even using different types of materials, and then connected together to form the wafer assembly. In this case, there is a break in the material between the device and the holding tabs, between the tabs and the sidewalls, and between the sidewalls and the frame bars. When describing the device as being connected to the tabs, the tabs connected to the sidewalls, and the sidewalls connected to the bars, the word "connect" literally means attaching the different pieces together.

Figure 1A:
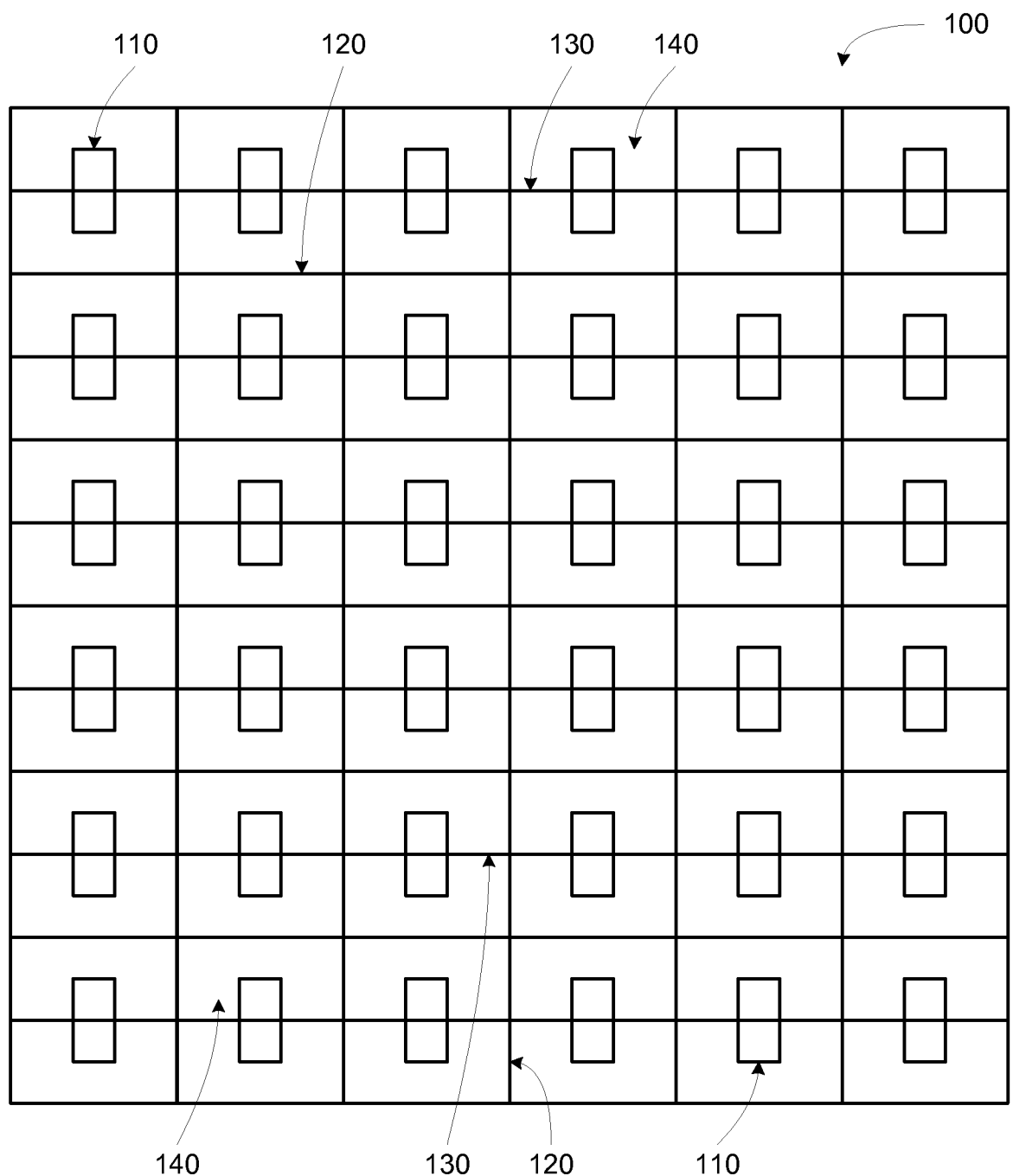
FIG. 1A illustrates a method of holding multiple semiconductor devices in a wafer assembly.
Figure 1B:
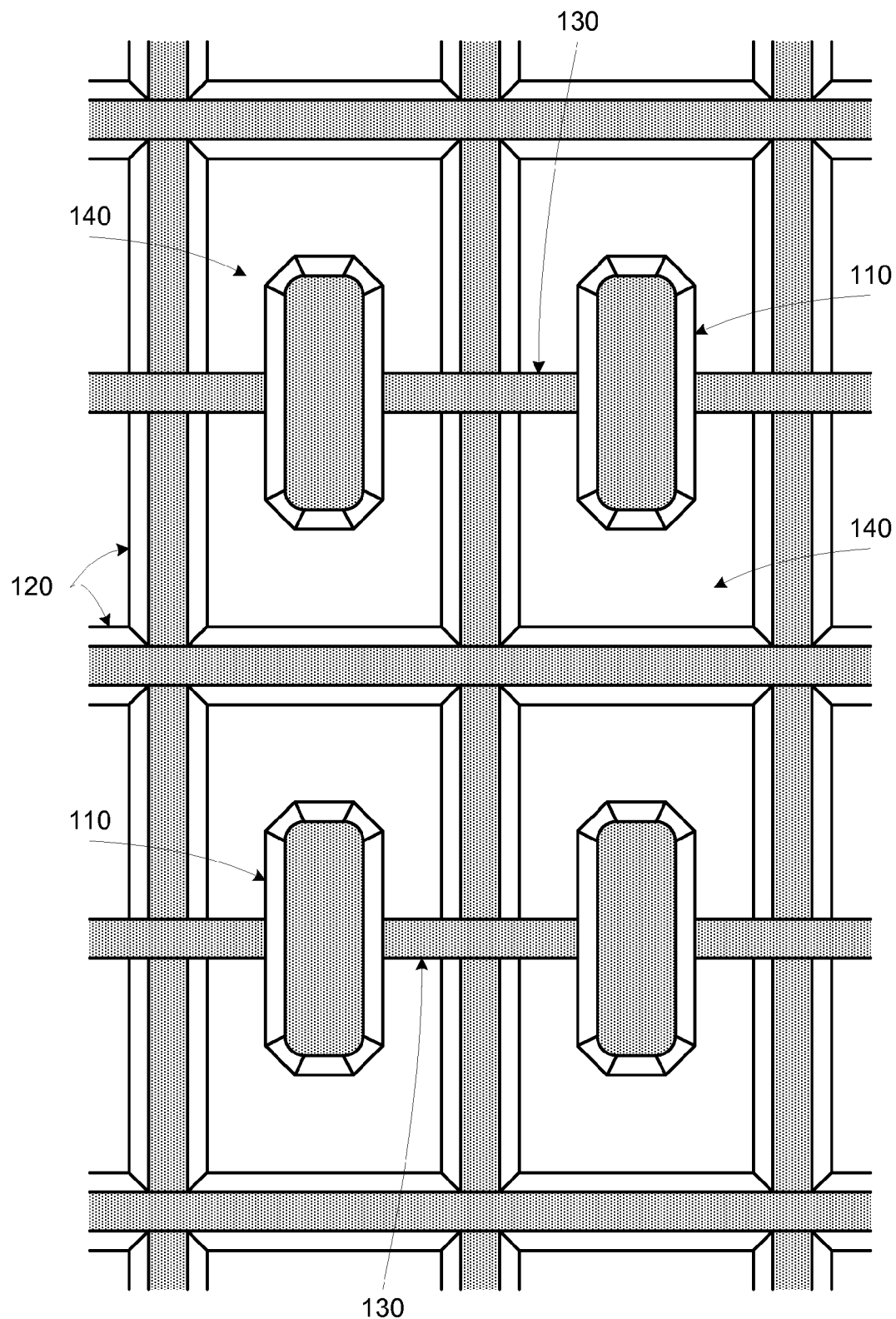
FIG. 1B illustrates a backview of a magnified portion of the wafer assembly illustrated in FIG. 1A.
Figure 2A:
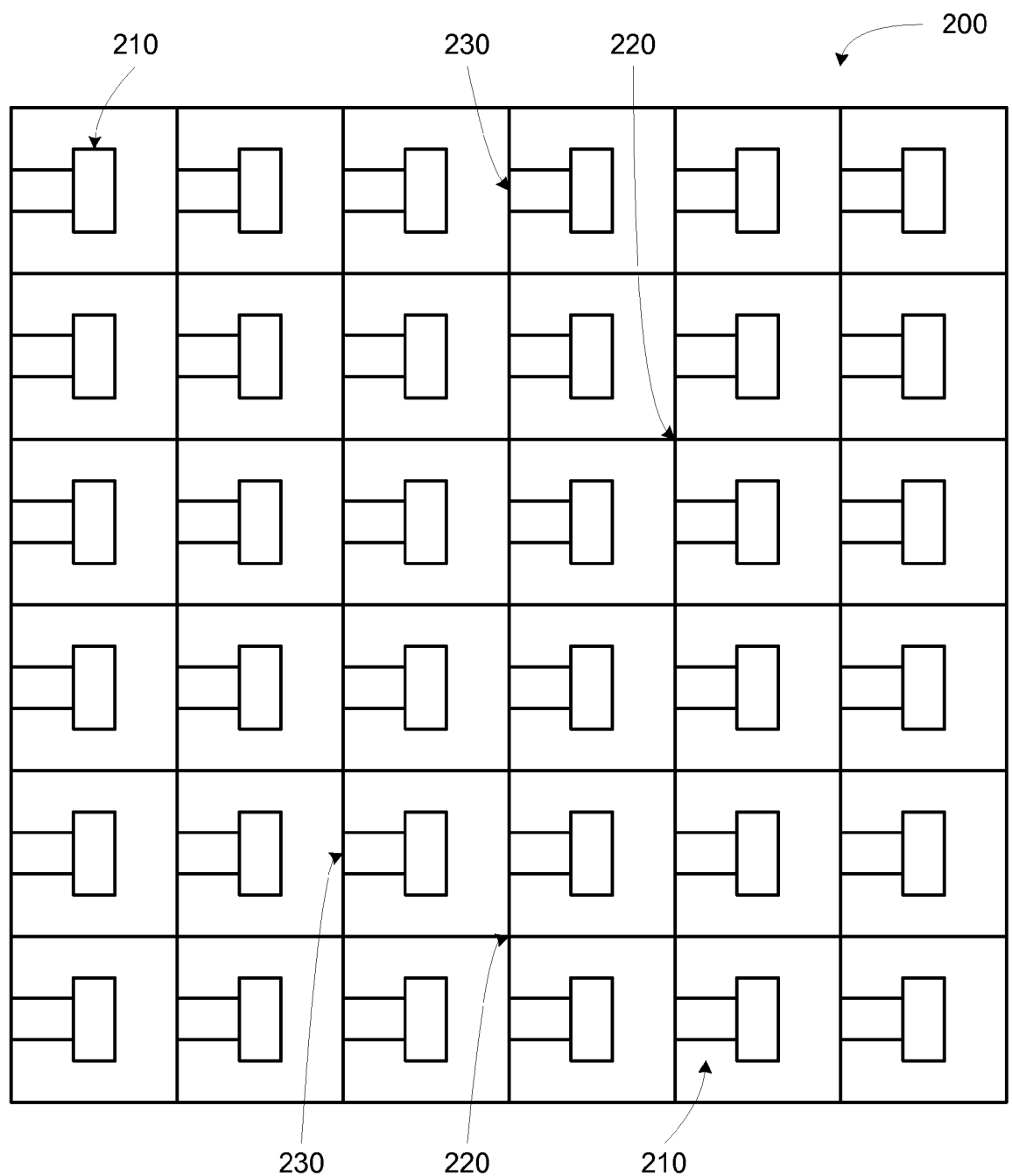
FIG. 2A illustrates another method of holding multiple semiconductor devices in a wafer assembly.
Figure 2B:
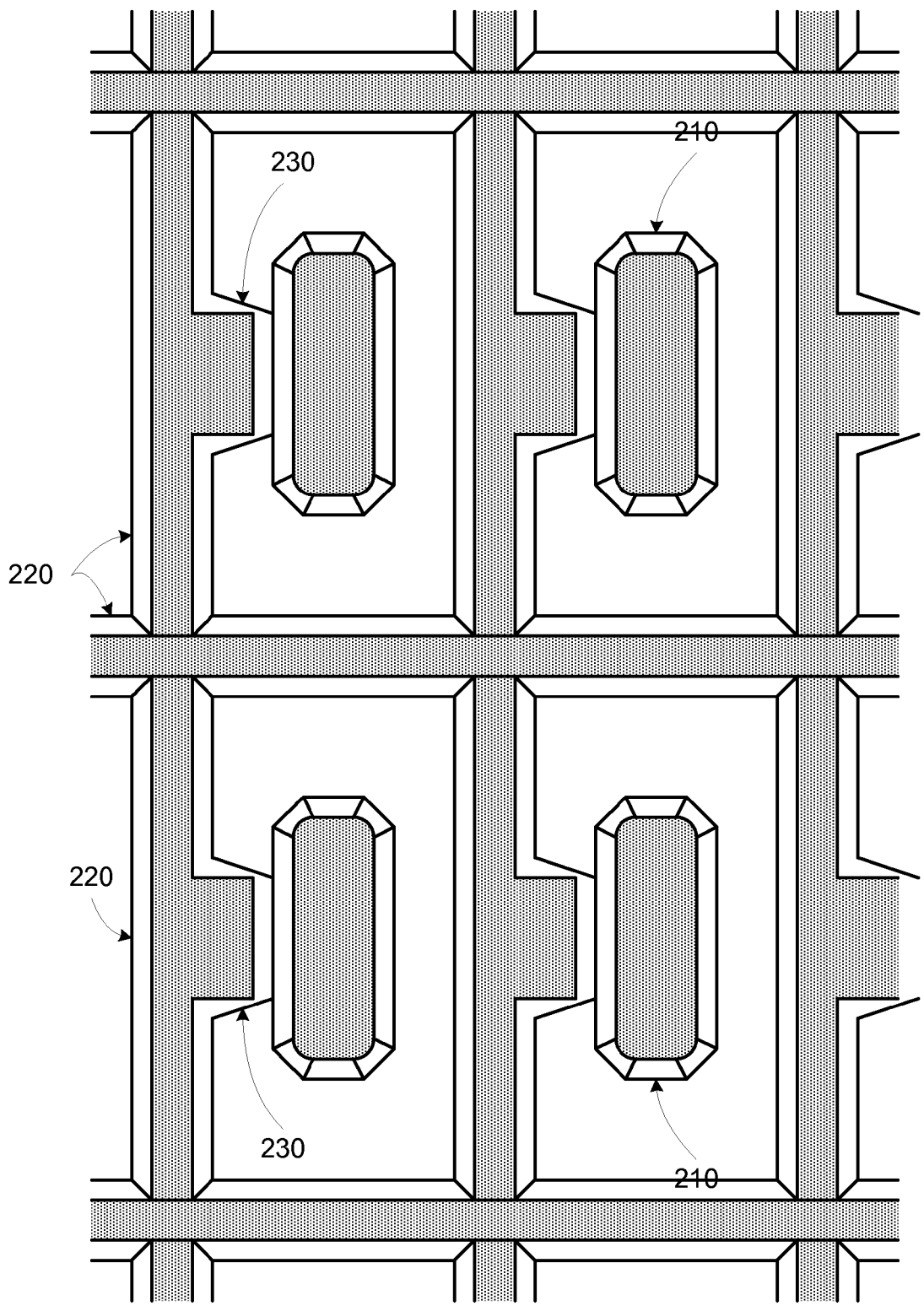
FIG. 2B illustrates a backview of a magnified portion of the wafer assembly illustrated in FIG. 2A.

The present invention has several advantages over the existing methods of holding semiconductor devices in a wafer assembly. For example, for the type of wafer assembly described in FIG. 1A, the dies may only be broken free individually, one at a time, because frames surround all four sides of each single die. In contrast, with the present invention, the dies (devices) are attached to the frames (horizontal bars) only from one side, allowing an entire row of dies to be broken free together. More significantly, in the present invention the device is not enclosed in a four-sided frame as it is done in the prior art. The portion, which is out of the U-tab, helps easy, safe, and splinter free pick up.

A number of implementations of the invention have been described. Nevertheless, it will be understood that various modifications may be made without departing from the spirit and scope of the invention. Accordingly, other embodiments are within the scope of the following claims.

The invention claimed is:

1. A method for forming a semiconductor device holder on a wafer, comprising: etching a first pattern to a first depth into a top of the wafer, wherein the first pattern comprises a semiconductor device, a bar extending in a first direction, a first sidewall extending in a second direction orthogonal to the first direction, and a first tab extending parallel to the first direction, wherein the semiconductor device is connected to the bar through a series of the first tab and the first sidewall, and the first depth equals the thickness of the first tab; and etching a second pattern to a second depth into a bottom of the wafer, wherein the second pattern comprises the semiconductor device, the bar, the first sidewall, and the second sidewall but does not include the first tab, wherein the first sidewall extends from a first end thereof connected only to the bar to a second end thereof connected to the first tab and not connected to any similar bar, the second depth equals the thickness of the wafer minus the thickness of the first tab, and the first depth is less than the second depth.

2. The method, as described in claim 1, wherein the first pattern further comprises a second sidewall extending parallel to the second direction and a second tab extending parallel to the first direction, wherein the semiconductor device is additionally connected to the bar through a series of the second tab and the second sidewall and wherein the second sidewall extends from a first end thereof connected only to the bar to a second end thereof connected to the second tab and not connected to any similar bar, and the second pattern further comprises the second sidewall.

3. The method, as described in claim 2, wherein
  the thickness of the second tab equals the thickness of the first tab, and
  the thickness of the second sidewall equals the thickness of the first sidewall.

4. The method, as described in claim 1, wherein etching the first pattern to the first depth into the top of the wafer includes forming a top mask layer over the top of the wafer, forming a top photoresist layer over the top mask, transferring the first pattern onto the top photoresist layer, transferring the first pattern onto the top mask layer by etching the top mask layer using the top photoresist layer as a mask, and etching the top of the wafer using the top mask layer as a mask to the first depth.

5. The method, as described in claim 1, wherein etching the second pattern to the second depth into the bottom of the wafer includes forming a bottom mask layer over the bottom of the wafer, forming a bottom photoresist layer over the bottom mask, transferring the second pattern onto the bottom photoresist layer, wherein a position of the second pattern aligns with a position of the first pattern, transferring the second pattern onto the bottom mask layer by etching the bottom mask layer using the bottom photoresist layer as a mask, and etching the bottom of the wafer using the bottom mask layer as a mask to the second depth.

6. The apparatus, as described in claim 1, wherein the first depth is not greater than 100 microns.

7. The method, as described in claim 1, wherein the first depth is not greater than 65 microns.

8. The method, as described in claim 1, wherein the first depth is not greater than 30 microns.

9. The method, as described in claim 1, wherein the first depth is not greater than 50% of the second depth.

10. The method, as described in claim 1, wherein the first depth is not greater than 30% of the second depth.

11. The method, as described in claim 1, wherein the first depth is not greater than 10% of the second depth.

12. The method, as described in claim 1, wherein the second pattern does not include a first tab.

13. The method, as described in claim 1, wherein the etching of the second pattern forms a planar lower portion of the first tab at the second depth.

14. A method for forming an array of semiconductor devices on a wafer, comprising: etching a first pattern to a first depth into a top of the wafer, wherein the first pattern comprises a plurality of semiconductor devices, a plurality of bars extending parallel to a horizontal first direction, a plurality of first sidewalls extending parallel to a horizontal second direction perpendicular to the first direction, and a plurality of first tabs extending parallel to the first direction from first sides of respective ones of the semiconductor devices to respective ones of the first sidewalls, wherein each first sidewall extends only between a respective one of the tabs and only a respective one of the bars; and etching a second pattern to a second depth into a bottom of the wafer, wherein the pattern comprises the semiconductor devices, the bars, and the first sidewalls but does not include the first tabs.

15. The method, as described in claim 14, wherein the first pattern further comprises second tabs extending parallel to oppositely the first direction from second sides of the respective ones of the semiconductor devices to one of the sidewalls other than the respective ones of the sidewalls, and wherein the second pattern does not include the second tabs.

16. The method, as described in claim 14, wherein the step of etching the second pattern forms planar bottom portions of the first tabs.

17. A method for forming an array of semiconductor devices on a wafer, comprising: etching a first pattern to a first depth into a top of the wafer, wherein the first pattern comprises a plurality of semiconductor devices, a plurality of bars extending parallel to a horizontal first direction, a plurality of first sidewalls extending parallel to a horizontal second direction perpendicular to the first direction, and a plurality of first tabs extending parallel to the first direction from first sides of respective ones of the semiconductor devices to respective ones of the first sidewalls at respective junctures, wherein the bars, the first sidewalls, and the tabs are formed in a layer, each first sidewall extends between a respective joining point of a respective one of the tabs and a respective one of the bars, and respective gaps are formed in the layer between the respective junctures and one of the bars other than the respective one of the bars; and etching a second pattern to a second depth into a bottom of the wafer, wherein the second pattern comprises the semiconductor devices, the bars, and the first sidewalls but does not include the first tabs, thereby supporting each of the semiconductor devices on only a respective one of the bars.

* * * * *